United States Patent [19]

Araki et al.

[11] Patent Number: 4,911,350
[45] Date of Patent: Mar. 27, 1990

[54] SEMICONDUCTOR BONDING MEANS HAVING AN IMPROVED CAPILLARY AND METHOD OF USING THE SAME

[75] Inventors: Kouji Araki; Toshihiro Kato, both of Kanagawa, Japan

[73] Assignee: Kabushiki Kaisha Toshiba, Kanagawa, Japan

[21] Appl. No.: 327,626

[22] Filed: Mar. 24, 1989

[30] Foreign Application Priority Data

Apr. 25, 1988 [JP] Japan .................. 63-102000

[51] Int. Cl.⁴ ............................................. B23K 19/04
[52] U.S. Cl. ..................................... 228/110; 228/1.1
[58] Field of Search .................. 228/1.1, 4.5, 41, 44.7, 228/54, 110, 179

[56] References Cited

U.S. PATENT DOCUMENTS 3,921,884  11/1975  McDonough et al. ............. 228/44.7
4,405,074   9/1983  Levintov et al. ................... 228/41

FOREIGN PATENT DOCUMENTS 160168  12/1979  Japan ................................. 228/44.7

Primary Examiner—M. Jordan
Attorney, Agent, or Firm—Finnegan, Henderson, Farabow, Garrett and Dunner

[57] ABSTRACT

A wire bonding capillary for a bonding process comprises an elongated capillary body having an axial bore through the body for receiving a wire of a predetermined diameter to be bonded, and a working face on one end of the body for applying force to the bonding wire during the bonding process. The working face includes a first surface portion surrounding the bore and having a first radius of curvature, and a second surface portion adjacent to the first surface portion and having a second radius of curvature smaller than the first radius curvature.

6 Claims, 4 Drawing Sheets

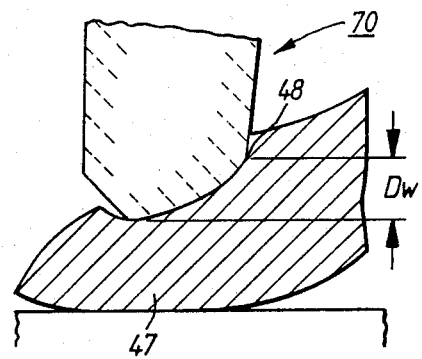
Fig. 9.
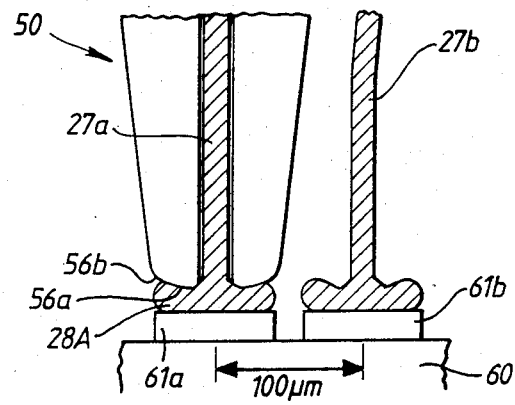
Fig. 10. A
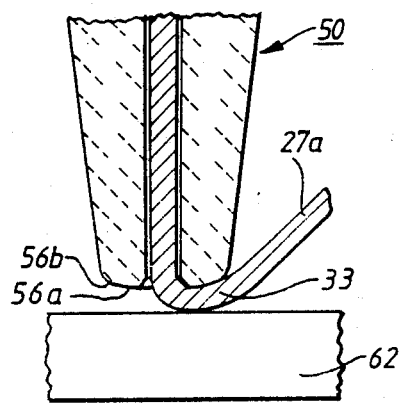
Fig. 10.B
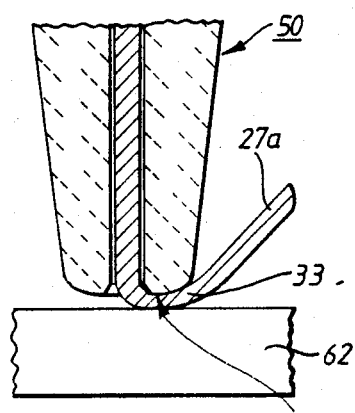
Fig. 10.C

SEMICONDUCTOR BONDING MEANS HAVING AN IMPROVED CAPILLARY AND METHOD OF USING THE SAME

BACKGROUND OF THE INVENTION

1. Field of the Invention

This invention concerns the capillary of a wire-bonding apparatus and methods of manufacturing semiconductor devices using wire bonding apparatus having capillaries.

More particularly, this invention concerns the particular shape of the working face of the capillary.

2. Description of the Prior Art

In wire bonding processes for connecting predetermined positions, such as electrodes formed on a semiconductor chip of a lead frame, and inner lead portions, there are several alternatives. These include thermocompression bonding, ultrasonic wire bonding, etc. Recently, a so-called thermosonic wire bonding, namely a combination of thermocompression and ultrasonic bonding, has been widely used.

FIG. 1 is an expanded cross section view of a conventional capillary 10 in the vicinity of the head portion thereof. In the drawing, H, which is called the hole diameter, refers to the diameter of the bore guide region 2. The symbol $\theta c$, which is called the capillary cone angle, is the taper angle of an imaginary right cone of the capillary body 1, including the circular cone capillary side face 3 of the body 1. T is the diameter of a circle formed by the intersection of the imaginary right cone, including the capillary side face 3, and a plane X-X' which comprises the capillary tip surface 4 including capillary tip 5. The diameter T is called the capillary head diameter.

The bore guide portion 2 has chamfer, or is widened towards the tip 5 to form a bore throat region 7. The bore throat region 7 has the shape of a substantially truncated cone, and has a bore throat diameter B at its widest end.

The reference IC represents the degree of the chamfer, and is half of the difference between the bore throat diameter B and the hole diameter H.

The capillary 10 includes a working face 6 having a radius of curvature OR. The curved surface of the working face 6 terminates at point Q on the capillary side face 3. The letters Dw represents a distance from the point Q to the X-X' plane, which is called as working face height. Examples of typical dimensions are H=38 $\mu$m, $\theta c$=30°, T=203 $\mu$m, B=64 $\mu$m, IC=13 $\mu$m, OR=89 $\mu$m and Dw=25 $\mu$m.

Referring now to FIGS. 2 and 3, a thermosonic wire bonding process of manufacturing a semiconductor device using the conventional capillary is explained.

A bonding wire 17 made of gold (Au) is supplied through the bore guide portion 2. The bonding wire 17 has a ball portion 18 at the end thereof. An aluminium electrode 31, which is formed on a semiconductor chip 30 bonded on a lead frame 20, is previously heated to about 250 ° C. The ball portion 18 is positioned on the aluminium electrode 31 (called hereafter as bonding pad). (FIG. 2)

An ultrasonic vibration is applied to the capillary 10 substantially parallel to the face of aluminum bonding pad 31 while a force is applied to the ball 18 by the working face 6. The ball 18 is crushed to form the flattened shape 18A, and to increase the contact area with the pad 31. (FIG. 3)

During this process, any oxidation film which may be formed between the ball 18 and the bonding pad 31 is destroyed. Thus, the fresh or pure faces of the bonding wire and the bonding pad contact each other to form an alloy layer between them. In this way, the Au bonding wire 17 is bonded to the bonding pad 31.

Next, the capillary 10 is raised to a specific level above the bonding pad 31 with the bonding wire feeding through the bore guide portion 2. The capillary 10 and the pad 31 are then moved relative each other for bonding of the bonding wire at another location, such as an inner lead portion of the lead frame (not shown). At the new location, the bonding wire 17 is bonded by the same method described above, and a loop of the bonding wire is formed between the bonding pad and the inner lead portion. Finally, the capillary is raised to cut the bonding wire 17.

There is a market demand for high integration and size reduction of semiconductor devices. Thus, the pitch or distance between the bonding pads formed on a semiconductor chip continually is being reduced. The reduction of the pitch between the bonding pads creates a problem of damage to the bonding wire during the wire bonding process. Namely, the capillary 10 sometimes contacts a neighboring wire (illustrated in a dotted circle 12 in FIG. 4) which was previously bonded. Therefore, there is a practical minimum to the bonding pad pitch. The minimum of the pitch is about 160 $\mu$m for the conventional capillary.

To meet the demand of further reduction of the pitch, the present inventors tried to narrow the capillary core angle $\theta c$ and the capillary head diameter T, as shown in FIG. 5. In the trial, the inventors adopted dimensions, such as $\theta c$=15°, and T=165 $\mu$m, while keeping the hole diameter H, insert chamfer IC, bore throat diameter B and working face height Dw equal to the conventional capillary shown in FIG. 1. In this trial, the radius of curvature ORa of the working face 6a was 70 $\mu$m, which is somewhat smaller than in the capillary of FIG. 1.

The working face 6a applied a force to a bonding wire to crush the wire, and to effectuate a bond between the bonding wire and bonding pad or lead frame. Thus, the crushed shape of the wire was determined according to the shape of the working face. Therefore, by reducing the radius of curvature, the thickness of the bonding wire remaining on the lead frame increased sharply according to the shape of the working face of the capillary. In other words, the area supplied with the force by the capillary to achieve the bond became narrow by reducing the radius of curvature of the working face. Thus, the bondability became poor. The deterioration of the bondability can be fatal for a semiconductor device.

SUMMARY OF THE INVENTION

Therefore, an object of this invention is to produce a capillary which enables the further reduction of the bonding pad pitch while maintaining good bondability.

Another object is to provide a method of manufacturing a semiconductor device using the improved capillary.

To achieve the object, this invention provides a wire bonding capillary for a bonding process comprising: an elongated capillary body having an axial bore through the body for receiving a wire of a predetermined diameter to be bonded, and a working face on one end of the body for applying force to the bonding wire during the bonding process, the working face including; a first surface portion surrounding the bore and having a first radius of curvature, and a second surface portion adjacent to the first surface portion and have a second radius of curvature smaller than the first radius curvature.

This invention further provides a method of manufacturing a semiconductor device, comprising the steps of: forming a bonding pad on a semiconductor device; feeding a bonding wire of a predetermined diameter onto the bonding pad through an axial bore of a wire bonding capillary having a working face thereon which includes a first surface portion surrounding the bore having a first radius of curvature and a second surface portion adjacent to the first surface portion and having a second radius of curvature smaller than the first radius a curvature; simultaneously forcing the first and second surface portions of the working face against the bonding wire on the bonding pad for bonding the wire to the pad.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings:

FIG. 9 is a diagram for explaining the relationship between the working face height Dw and the diameter of the bonding wire.

FIG. 10A, FIG. 10B and FIG. 10C are cross sectional views for explaining the process of using the improved capillary according to the present invention.

DETAILED DESCRIPTION OF THE INVENTION

Figure 6:
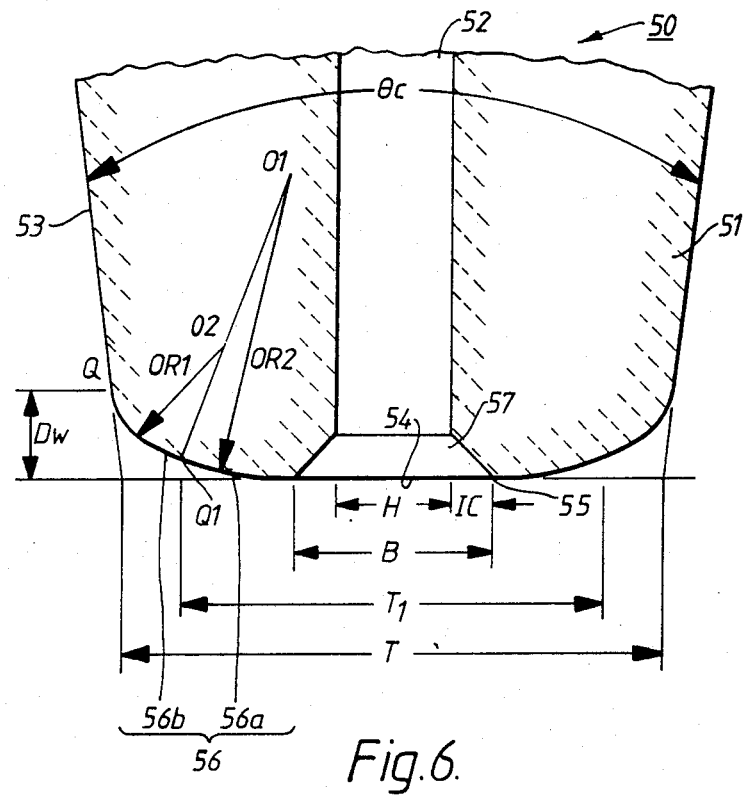
FIG. 6 is an elongated cross sectional view of an improved capillary according to the present invention.

Referring now to FIG. 6, a preferred embodiment of the present invention will be explained.

FIG. 6 is a cross sectional view along the elongated direction of the central axis of a capillary 50. In the drawing, the capillary 50 comprises a capillary body 51, a bore guide portion 52 for receiving a bonding wire and a bore throat region 57 at a widened end portion of the bore guide portion 52.

The capillary 50 has a working face 56 which includes a first surface portion 56a and a second surface portion 56b. The first surface portion 56a surrounds the bore throat 57 and extends from the capillary tip 55. The radius of curvature of the first surface portion 56a is OR1. The second surface portion 56b, having a radius of curvature OR2, continuously extends from the first surface portion 56a. The radius of curvature OR2 is smaller than OR1. In this example, the dimensions of the hole diameter H, the bore throat diameter B, the insert chamfer IC and the working face height Dw are as follows:

$$H=38 \ \mu m, \ B=64 \ \mu m, \ IC=13 \ \mu m, \ Dw=25 \ \mu m.$$

Figure 1:
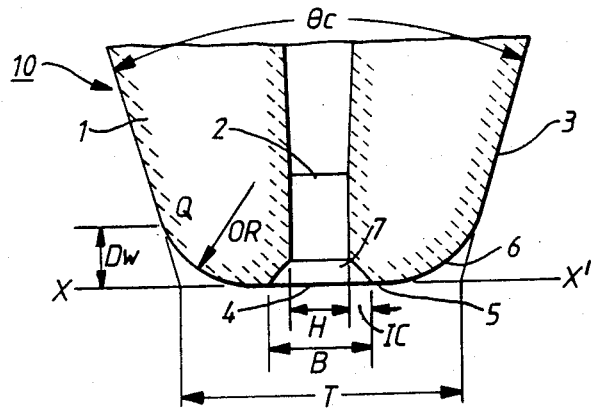
FIG. 1 is an enlarged cross sectional view of a conventional capillary in the vicinity of the working surface.
Figure 2:
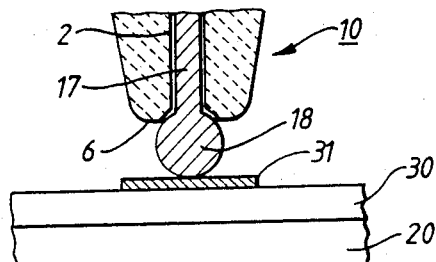
FIG. 2 and FIG. 3 are cross sectional views illustrating a conventional process using the conventional capillary.
Figure 3:
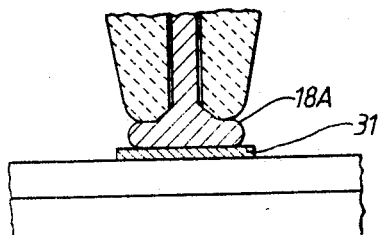

These dimensions are equal to those of the conventional capillary of FIG. 1. The radius of curvature OR1 of the first surface portion 56a is 89 μm, and is substantially equal to that of FIG. 1. The OR2 of the second surface portion 56b is 37 μm. The second surface 56b extends outwardly from the first surface 56a and terminates at the point Q on the circular cone capillary side surface 53 of the capillary body 51.

The center 02 of the circle of radius OR2 lies on a line between the center 01 of the circle of the radius OR1 and a point of contact Q1. In other words, the tangent lines of the both circles at the point Q1 are incident. Thus, the second surface portion 56b smoothly continues from the first surface portion 56a. The diameter of the circle defined by perpendicular line from the point Q1 to the plane X-X' is represented by T1. An example of the diameter T1 is 130 μm.

By separating the working face into two sections, each having a different radius of curvature, the capillary cone angle $\theta c$ and the capillary head diameter T can be reduced significantly compared with the conventional capillary 10 of FIG. 1. Specifically, the capillary cone angle $\theta c$ is 15° and the capillary head diameter T is 165 μm.

Generally speaking, the bondability of thermosonic wirebonding is determined by bonding force, ultrasonic output, ultrasonic supply time and temperature, etc.

Figure 7:
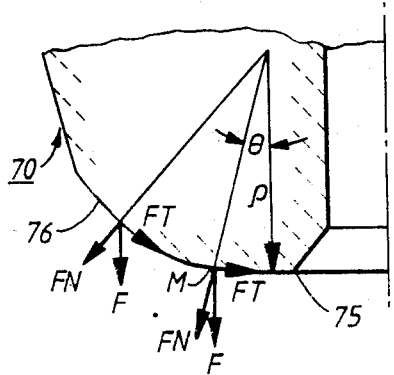
FIG. 7 is a diagram for explaining the relationship between the radius of curvature and force elements.

FIG. 7 is a diagram for explaining how the bonding force is applied to the bonding wire (including the ball portion) by the capillary. In the drawing, the capillary 70 has a working face 76 having a radius of curvature p. For example, the bonding force F at the point M is decomposed into the tangent line component FT and the radius component FN, which is perpendicular to the FT. The bonding wire is supplied with a force for the plastic deformation thereof mainly by the radius component FN. The radius component FN has a maximum value at the capillary tip 75, and gradually and proportionately decreases in accordance with the remote from the capillary tip 75 or the increase of the angle $\theta$.

Figure 5:
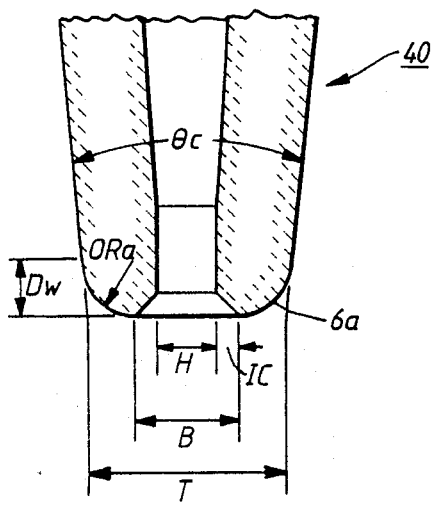
FIG. 5 is a cross sectional view of a capillary which the inventors tested.
Figure 8:
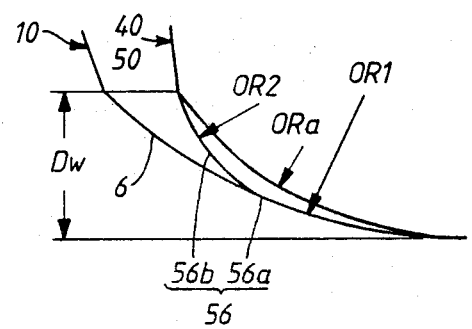
FIG. 8 is a diagram for explaining the relationship between the radius of curvatures of the conventional capillary, test capillary and the capillary according to the present invention.

FIG. 8 is a diagram for explaining and for comparing the shape of the working faces of the conventional capillary 10 of FIG. 1, the test capillary 40 of FIG. 5 and the capillary 50 according to the present invention, with coincidence of the center of the bore guide portions thereof.

The radius component FN of the bonding force at a certain portion of the capillary decreases rapidly in accordance with the remoteness from the capillary tip, in the case where the capillary has a small radius. Therefore, it is impossible to apply a sufficient plastic deformation to the bonding wire. Thus, the bondability is insufficient, and in particular, the bondability at the inner lead side is poor. However, as the radius of curvature is made small, it is favorable to achieve a sufficient dimension for the working face height Dw without widening the capillary head diameter T. The relationship between the working face height Dw and the diameter of the bonding wire will be explained later.

In the present invention, the working face is divided into two parts. The first surface portion surrounding the bore throat region has a large radius of curvature OR1. Thus, a large radius force component FN, which is effective to the bonding, is achieved at the first surface portion 56a.

The second surface portion 56b, which is remote from the bore throat region, has a small radius of curvature OR2. The remote portion from the bore throat region is not so effective for bonding in the conventional capillary. Thus, the small radius of curvature of the second surface portion does not make the bondability worse compared with the conventional capillary. Therefore, a bondability equivalent to that of the conventional capillary is maintained. The small radius of curvature effectively reduces the capillary head diameter T, and the reduction of the dimension of T is achieved, When the working face height Dw is smaller than the diameter of the bonding wire 47, a discontinuous portion 48 occurs as shown in FIG. 9. A crack is easily created at the discontinuous portion 48 during the following mechanical and thermal processing, and the wire may be broken. Therefore, the reliability is reduced. Thus, it is preferably to make the working face height Dw equal to or larger than the diameter of the bonding wire. In the present invention, the second surface portion, which is not so effective for providing bonding force to the bonding wire, has a small radius of curvature. Thus, a sufficient dimension for the Dw is achieved without widening the capillary head diameter T so much, while maintaining the reliability of bonding or bondability.

Furthermore, it should be noted that the first and the second surface portions each has a first and a second radius of curvature, and the tangent lines thereof are coincident at the point Q, as shown in FIG. 6. Thus, the second surface portion 56b extends from the first surface portion 56a smoothly. Therefore, by setting the working surface height Dw equal to or larger than the diameter of the bonding wire, no discontinuous portion is formed by the capillary.

Now, an example of the process for manufacturing a semiconductor device using the capillary according to the present invention will be explained referring to the FIGS.10A to 10C.

At first, a semiconductor chip 60 is mounted on a bed portion of a lead frame (not shown). The semiconductor chip 60 includes aluminum bonding pads 61a and 61b on the surface thereof. The pitch of the bonding pads is 100 $\mu$m, for example. The numeral 500 designates a capillary according to the present invention. An Au bonding wire 27a of 25 $\mu$m diameter is used. In the condition of FIG. 10A, the bonding pad 61b is already bonded with the bonding wire 27b.

A ball portion (not shown) of the bonding wire 27a is positioned on the pad 61a. A bonding force is applied to the ball portion using the surface portions 56a and 56b with an ultrasonic vibration to form a flattened ball portion 28A, and to apply a plastic deformation thereto.(FIG. 10A)

Next, the capillary 50 is raised to a specific level above the bonding pad 61 and chip 60 with the lead wire feeding through the capillary.

Then, the capillary 50 and the chip 60 are moved relative to each other for bonding the lead wire at another location, such as an inner lead portion 62 of the lead frame, to form a loop. The loop end 33 of the bonding wire 27a is positioned on the lead frame 62 to make a contact between them.(FIG. 10B) The lead frame 62 is previously heated to about 250 ° C.

Then, an ultrasonic vibration is applied to the bonding portion by the working faces 56a and 56b.

Next, the bonding wire is cramped with a cramper (not shown), and the cramper is moved to cut the bonding wire 27a at the point 35. (FIG. 10C)

Then, the edge (not shwon) of the bonding wire projecting from the capillary is melted using, e.g., a spark discharge, to form a ball portion (not shown).

After that, the same process is continued at a plurality of bonding pads on the semiconductor device, and the wiring process for the semiconductor device is completed.

Figure 4:
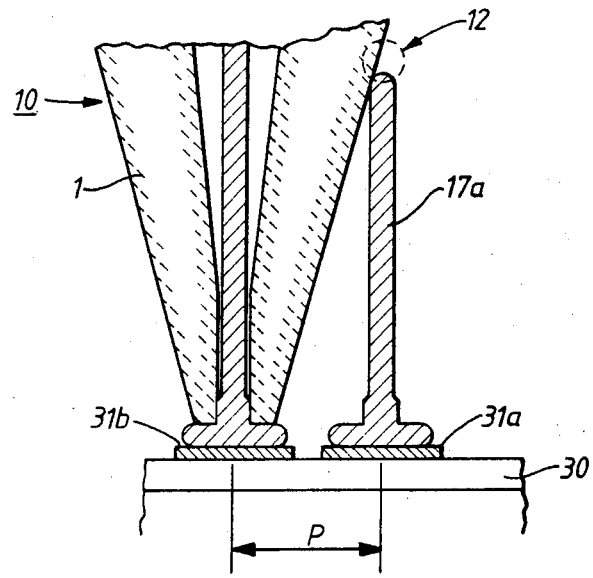
FIG. 4 is a cross sectional view illustrating the condition wherein the capillary and the bonding wire are in contact with each other.

The following table 1 shows the result of wire bonding using the conventional capillary of FIG. 1, the test device of FIG. 4 and the capillary according to the present invention as shown in FIG. 6.

TABLE 1

| | capillaries | | |
|---|---|---|---|
| items | the present invention | the test | conventional |
| T ($\mu$m) | 165 | 165 | 203 |
| $\theta c$(°C.) | 15 | 15 | 30 |
| OR | OR1 = 89 OR2 = 37 | 70 | 89 |
| inferior limit of pad pitch ($\mu$m) | 100 | 100 | 160 |
| average of wire pull strength | 9.9 | 3.2 | 9.8 |
| total evaluation | O | x | Δ | note 1: O...excellent, Δ...medium, x...poor
note 2: the average of the pull strength is the mean value of the maximum pull strength (g) in the test to the several semiconductor devices by applying the pull strength to the bonding wire at the center between the bonding pad on the semiconductor pellet and the inner lead frame, using 25 $\mu$m Au wire.

In accordance with the table 1, the average pull strength of the present invention is larger than that of the conventional capillary. This means a bondability at least as high as the conventional capillary is maintained. The minimum limit of the bonding pad pitch is reduced significantly and improved compared with the conventional capillary.

In the embodiment explained above, the radius of curvature of the first surface portion is equal to that of the conventional capillary. However, it is not restricted to that dimension. Furthermore, the working face is divided into two sections in the embodiment. However, it is not restricted to that construction. Namely, it is posible to divide the surface into more than two sections. In such case, the more the surface portion is remote from the capillary tip, the smaller the radius of curvature thereof may be. The capillary of the present invention can be used in process other than the thermosonic wire bonding process, such as thermocompression bonding, etc.

The present invention has been described with respect to a specific embodiment. However, other embodiments based on the principles of the present invention should be obvious to those or ordinary skill in the art. Such embodiments are intended to be covered by the claims.

What is claimed is:

1. A wire bonding capillary for a bonding process comprising:
   an elongated capillary body having an axial bore through the body for receiving a wire of a predetermined diameter to be bonded, and a working face on one end of the body for applying force to the bonding wire during the bonding process, the working face including;
   a first surface portion surrounding the bore and having a first radius of curvature, and
   a second surface portion adjacent to the first surface portion and having a second radius of curvature smaller than the first radius curvature.

2. The wire bonding capillary according to claim 1, wherein the body includes a cone-shaped capillary side face, and the second surface portion includes a junction with the side face.

3. The wire bonding capillary according to claim 2, wherein the working face includes a distal tip, and the minimum distance between a pair of lines perpendicular to the axis of the body, one through the tip and one through the junction is equal to the predetermined diameter of the bonding wire.

4. The wire bonding capillary according to claim 1, wherein the working face includes an intersection point, the second surface portion joining the first surface portion at the intersection point.

5. A method of manufacturing a semiconductor device, comprising the steps of:
   forming a bonding pad on a semiconductor device;
   feeding a bonding wire of a predetermined diameter onto the bonding pad through an axial bore of a wire bonding capillary having a working face thereon which includes a first surface portion surrounding the bore having a first radius of curvature and a second surface portion adjacent to the first surface portion and having a second radius of curvature smaller than the first radius curvature; simultaneously forcing the first and second surface portions of the working face against the bonding wire on the bonding pad for bonding the wire to the pad.

6. The method of manufacturing a semiconductor device according to claim 5, wherein the step of forcing the surface portions includes the step of ultrasonically vibrating the first and second surface portions.

* * * * *